United States Patent [19]
Drafts et al.

[11] Patent Number: 5,923,162
[45] Date of Patent: Jul. 13, 1999

[54] NON-INDUCTIVE LEAD PATH HALL EFFECT ELECTRICAL CURRENT SENSOR

[75] Inventors: William A. Drafts; David E. Barry; Peter Harris, all of Orlando, Fla.

[73] Assignee: Bell Technologies Inc., Orlando, Fla.

[21] Appl. No.: 08/844,132

[22] Filed: Apr. 18, 1997

[51] Int. Cl.$^6$ .................................................. G01R 33/02
[52] U.S. Cl. ...................................................... 324/117 H
[58] Field of Search ........................... 324/117 H, 117 R, 324/225, 251; 327/511; 338/32

[56] References Cited

U.S. PATENT DOCUMENTS

| | | | |
|---|---|---|---|
| 3,551,706 | 12/1970 | Chapman | 338/32 |
| 5,146,156 | 9/1992 | Marcel | 324/117 H |
| 5,416,407 | 5/1995 | Drafts | 324/117 H |

*Primary Examiner*—Vinh P. Nguyen
*Attorney, Agent, or Firm*—Stein, Schifino & Van Der Wall

[57] ABSTRACT

An electric current sensor employing a Hall effect generator to be used in measuring electrical currents flowing in a current carrying conductor including a printed circuit board, an amplifier, a control current source, a toroid core having a gap, a Hall effect generator, and first and second traces configured on the printed circuit board so as to be non-inductive when exposed to the impinging magnetic field concentrated by the toroid core across the gap and across the Hall effect generator. The non-inductive configuration of the first and second traces is composed of a plated through hole electrically coupling the first and second traces to form a loop having a loop area equal to zero that is perpendicular to the directional flow of the impinging magnetic field thereby preventing the generation of unwanted induced voltages in the current sensor.

6 Claims, 3 Drawing Sheets

NON-INDUCTIVE LEAD PATH HALL EFFECT ELECTRICAL CURRENT SENSOR

BACKGROUND OF THE INVENTION

1. Field of the Invention

This invention relates to an electrical current sensor and, more particularly, to a transient response compensated current sensor that utilizes a Hall effect generator and non-inductive lead paths to eliminate any inductive loop area from exposure to the magnetic field produced by the electrical current being measured.

2. Description of the Background Art

Presently, many types of electrical current sensing sensors are known and are in wide use today throughout the electronics industry. Many of these sensors include a Hall effect generator that senses the magnetic field associated with an electrical current and, in turn, produces a Hall effect output voltage that is proportional to the magnetic field. However, many applications involve the measurement of an alternating or transient current. In these applications, errors in the Hall effect voltage will occur due to the changing magnetic field associated with the measured time varying current.

More particularly, the Hall effect output voltage is the voltage produced across opposite edges of an electrical current-carrying conductor when placed in a magnetic field. The basis of this effect, which depends upon the deflection of charged particles moving in a magnetic field, is the Lorentz force ($F=Q(V\times B)$). This force is in a direction mutually perpendicular to the path of the particle movement and the magnetic field direction. As a result, an output voltage occurs across the Hall effect generator. This output voltage has a magnitude that depends upon the magnitude and angle of the impinging magnetic field, the Hall coefficient and the excitation current in the Hall effect generator. When the excitation current is held constant, the output voltage is proportional to the magnetic field produced by the current being sensed or measured.

Hall effect generators generally comprise a layer of homogeneous semiconductor material, known as the Hall plate, constructed upon a dielectric substrate. The excitation current is applied to the Hall plate through the use of contacts positioned on opposite ends of the Hall plate. When the Hall effect generator is placed in a magnetic field and supplied with excitation current, the Hall effect output voltage is produced in the Hall plate which is orthogonal to the magnetic field and the excitation current. In order to measure this Hall effect output voltage, output leads are attached to the Hall plate in a position opposite to each other and on the axis of the Hall effect output voltage. Thus, the output leads are also exposed to the magnetic field which is impinging upon the Hall effect generator.

As a result of the output leads being exposed to the magnetic field, unwanted voltages will be induced into the leads due to electromagnetic coupling occurring when the current being sensed is a time varying current. These induced voltages will add to the actual Hall effect output voltage formed in the Hall plate and cause errors in the measurement of the sensed current. As the magnitude and frequency of the time varying magnetic field increase, the induced voltages in the output leads will become larger and larger with respect to the actual Hall effect output voltage that is produced in the Hall plate.

Various types of sensing devices utilizing the Hall effect phenomena have been used in the past with an attempt to eliminate the error causing induced voltages in the output leads of the Hall generator. One example of a method for compensating for the induced voltages is seen in U.S. Pat. No. 3,551,706 (commonly assigned with this application), the disclosure of which is hereby incorporated by reference herein. In this patent, a pickup loop is mounted on the dielectric substrate of the Hall effect generator in an area aligned with the normal sensitivity area of the Hall plate also constructed on the substrate. The pickup loop is positioned in close proximity to the Hall plate to sense the same flux as that which impinges upon the Hall plate. The pickup loop is connected to the Hall effect output leads and is made much larger than any other loops formed by the output leads. The output leads including the pickup loop are then connected to a circuit which has a frequency response that complements the response produced by the interaction of the responses of the Hall plate, the pickup loop and the output leads to the impinging flux, thereby providing a resultant output response from the circuit that is flat within wide frequency ranges up to 4 MHz.

The Hall effect sensor disclosed in U.S. Pat. No. 3,551,706 achieved substantial commercial success. However, the difficulty in both manufacture and tuning the circuit during test compromised the economics of the sensor.

Another example of a method for compensating for the induced voltages is seen in U.S. Pat. No. 5,416,407 (commonly assigned with this application), the disclosure of which is hereby incorporated by reference herein. In this patent, an inductive loop is positioned on a PCB board at edge of the gap of a toroid core such that the inductive loop is exposed to the same impinging magnetic field as the Hall plate. The inductive loop is then connected in series opposition to the output leads of the Hall generator such that the induced voltages from the inductive loop are canceled out with the induced voltages from the output leads of the Hall generator.

This alternative has proven to be commercially acceptable as well, however, the additional inductive loop incorporated therein also acts as an antenna to external fields and does not completely cancel the original unwanted signal due to limiting manufacturing tolerances.

Therefore, it is an object of this invention to provide an improvement which overcomes the aforementioned inadequacies of the prior art devices and provides an improvement which is a significant contribution to the advancement of the Hall effect electrical current sensing art.

Another object of this invention is to provide a current sensor having an improved transient response, thereby resulting in more accurate measurements of sensed time varying currents.

Another object of this invention is to provide a current sensor that employs a flip chip packaged Hall effect generator that is electrically coupled to conductor traces that are figured to have a zero loop area perpendicular to the impinging magnetic field, thereby eliminating any unwanted induced voltages.

Another object of this invention is to provide a current sensor employing a Hall effect generator that is cost effective and provides repeatability from unit to unit.

Another object of this invention is to provide a sensor for sensing electrical current in a current carrying conductor comprising in combination: a printed circuit board formed from a dielectric material, said printed circuit board having a first surface and a second surface; a toroid core having a gap, the toroid core being coupled to the printed circuit board so as to facilitate receiving the current carrying conductor through the toroid core; a Hall effect generator, the Hall effect generator being surface mounted to the printed circuit board and located within the gap of the toroid core, the Hall effect generator being free of inductive leads; current source means for providing a control current, the current source means being electrically coupled to the Hall effect generator; amplifier means for amplifying the output voltage from the Hall effect generator; non-inductive circuit means for electrically coupling the amplifier means to the Hall effect generator free from any unwanted induced voltages being generated therein by the magnetic field; whereby a magnetic field is created in the toroid core and across the gap and across the Hall effect generator when electrical current flows through the current carrying conductor, the Hall effect generator producing an output voltage that is proportional to the magnetic field, the Hall effect generator and the non-inductive circuit means facilitating the prevention of unwanted voltages being introduced into the output voltage thereby achieving an improved transient response.

The foregoing has outlined some of the pertinent objects of the invention. These objects should be construed to be merely illustrative of some of the more prominent features and applications of the intended invention. Many other beneficial results can be obtained by applying the disclosed invention in a different manner or by modifying the invention within the scope of the disclosure. Accordingly, other objects and a more comprehensive understanding of the invention may be obtained by referring to the summary of the invention, and the detailed description of the preferred embodiment in addition to the scope of the invention defined by the claims taken in conjunction with the accompanying drawings.

SUMMARY OF THE INVENTION

Unfortunately, for the sensing of time varying currents, problems exists with the current sensors generally available today in the industry. Specifically, unwanted induced voltages are being produced in the output leads that extend from the standard Hall effect generators that are utilized in the sensors. These output leads facilitate electrically coupling the output voltage to an amplifier but, also act to produce voltage transients when exposed to impinging magnetic fields. However, the present invention serves to alleviate this induced voltage problem that is normally associated with the measuring of time varying currents.

In better understanding the present invention, the invention is defined by the appended claims with the specific embodiment shown in the attached drawings. For the purpose of summarizing the invention, the invention comprises an electric current sensor employing a Hall effect generator to be used in measuring electrical currents flowing in an electrical current carrying conductor. The sensor comprises an amplifier, a control current source, a printed circuit board (PCB) having a first surface and a second surface, toroid core having a gap mounted perpendicular to the first and second surfaces of the printed circuit board, a Hall effect generator mounted on the first surface of the PCB board within the gap of the toroid core, and a non-inductive circuit means for electrically coupling the amplifier to the Hall effect generator free of any unwanted induced voltages from being generated by the magnetic field in the electrical traces.

The non-inductive circuit means itself is comprised of a first trace formed on the first surface of the PCB board that extends outward from under the Hall effect generator and from within the exposed region of the magnetic field. On the first surface, the first trace extends out to a plated through hole which extends down through the printed circuit board from the first surface to the second surface. On the second surface, a second trace continues from the plated through hole and extends along the same configuration as the first trace on the first surface in a mirror like fashion. Hence, the electrical loop formed by the first trace, the plated through hole and the second trace is parallel to the direction of the magnetic field flowing through the toroid core and across the gap such that a loop area of zero is achieved that is perpendicular to the magnetic field.

As is common in the industry, the electrical conductor whose current is to be sensed is positioned through the toroid core. The control current source provides the Hall effect generator with a constant temperature-compensated low level current. The electrical current flowing through the current carrying conductor generates a proportional magnetic field in the toroid core which, in turn, impinges upon the Hall effect generator. The Hall effect generator resultingly produces an output voltage that is proportional to the concentrated impinging magnetic field. This output voltage is then amplified to obtain a useful level.

The present invention prevents any unwanted induced voltages from being generated in the output leads due to the specific routing the output traces extending from the Hall effect generator in such a manner that removes any loop area formed by the traces that would be perpendicular to the direction of the impinging magnetic field. By configuring the traces on the PCB board for electrically coupling the output voltage of the Hall effect generator to an amplifier in this manner, all unwanted induced voltages that normally present problems in the current sensor designs of today are completely eliminated.

Importantly, the non-inductive resulting loop, being fabricated in the form of a plated through hole coupled to simple traces on the first and second surfaces of the PCB board, ensures low cost, ease of manufacture and a controlled process which gives excellent unit to unit repeatability.

Another important aspect of the present invention is that the Hall effect generator used herein and placed within the gap of the toroid core is packaged such that no inductive leads are extending outward from the packaged unit. It is important that the Hall effect generator not have any inductive leads extending therefrom so that no subsequent compensation would be required by the traces or other circuitry used to electrically couple the output voltage to the amplifier. Thus, by using a Hall effect generator that is packaged in a nature that is free of inductive leads, no compensation will be later required and the non-inductive trace configuration of the present invention can be utilized to complete the current sensor circuitry free from the problems associated with unwanted induced voltages.

An important feature of the present invention is that the current sensor has an improved transient response which results in more accurate measurements of sensed time varying currents.

Another important feature of the present invention is that a flip chip packaged Hall effect generator is employed that is free of any inductive leads extending outward therefrom so as to prevent any unwanted induced voltages from being generated and acting to degrade the measurement accuracy.

Another important feature of the present invention is that the current sensor employs a Hall effect generator that is electrically coupled to conductor traces that are figured to have a zero loop area perpendicular to the impinging magnetic field, thereby eliminating any unwanted induced voltages from being generated in the circuitry on the printed circuit board.

Another important feature of the present invention is that the current sensor employs a Hall effect generator that is cost effective and provides repeatability from unit to unit.

Another important feature of the present invention is that the current sensor, by employing flip chip packaged Hall effect generators having thin dimensions, allows for smaller gaps to be used in the toroid core resulting in an overall increased sensitivity of the current sensor and a more thorough flux flow through the toroid core.

The foregoing has outlined rather broadly, the more pertinent and important features of the present invention. The detailed description of the invention that follows is offered so that the present contribution to the art can be more fully appreciated. Additional features of the invention will be described hereinafter. These form the subject of the claims of the invention. It should be appreciated by those skilled in the art that the conception and the disclosed specific embodiment may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more succinct understanding of the nature and objects of the invention, reference should be directed to the following detailed description taken in connection with the accompanying drawings in which.

Similar reference characters refer to similar parts throughout the several views of the drawings.

DETAILED DESCRIPTION OF THE PREFERRED EMBODIMENT

Figure 1:
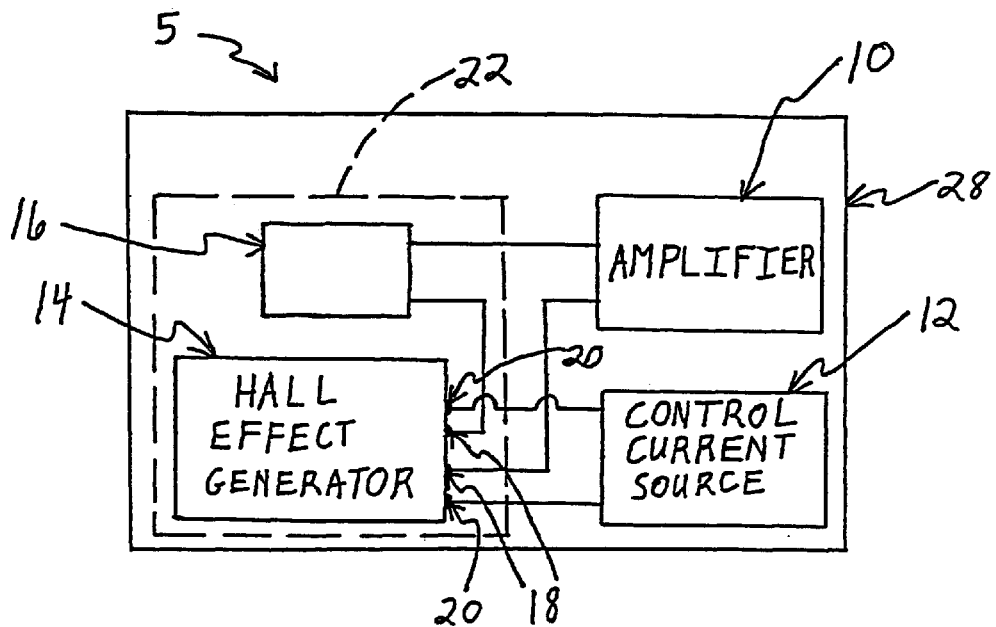
FIG. 1 is a block diagram representation of the amplifier, the control current source, the Hall effect generator and the non-inductive trace configuration of the electric current sensor of the present invention.

In referring first to FIG. 1, the current sensor 5 of the present invention can be seen to comprise an amplifier 10, a control current source 12, a Hall effect generator 14 and a non-inductive circuit means 16. The Hall effect generator 14 is comprised of a standard design having a semiconductor Hall plate (not shown) mounted on to a dielectric substrate (not shown). The Hall effect generator 14 further comprises output voltage terminals 18 and control current terminals 20. It can be further seen from FIG. 1 that the amplifier 10 is electrically coupled to the Hall effect generator 14 by way of the non-inductive circuit means 16.

Suitable Hall effect generators can be made from bulk indium arsenide (InAs), thin film InAs, gallium arsenide (GaAs) and indium antimonide (InSb). It is preferable that the Hall effect generator 14 used in the present invention be formed from thin film InAs so as to achieve a high sensitivity due to the higher drift mobility rate and thinner dimension capabilities associated with this material. The use of InAs also provides a higher Hall coefficient than GaAs and is very stable under operation. However, tradeoffs must ultimately be considered by the designer when choosing the specific thickness of the Hall effect generator 14 for a specific application since thinner designs have higher input and output resistances. It is desired to have low input and output resistances which facilitate low noise, low loading concerns and a low voltage drop. The lower the voltage drop, the lower the power consumption will be.

Figure 2:
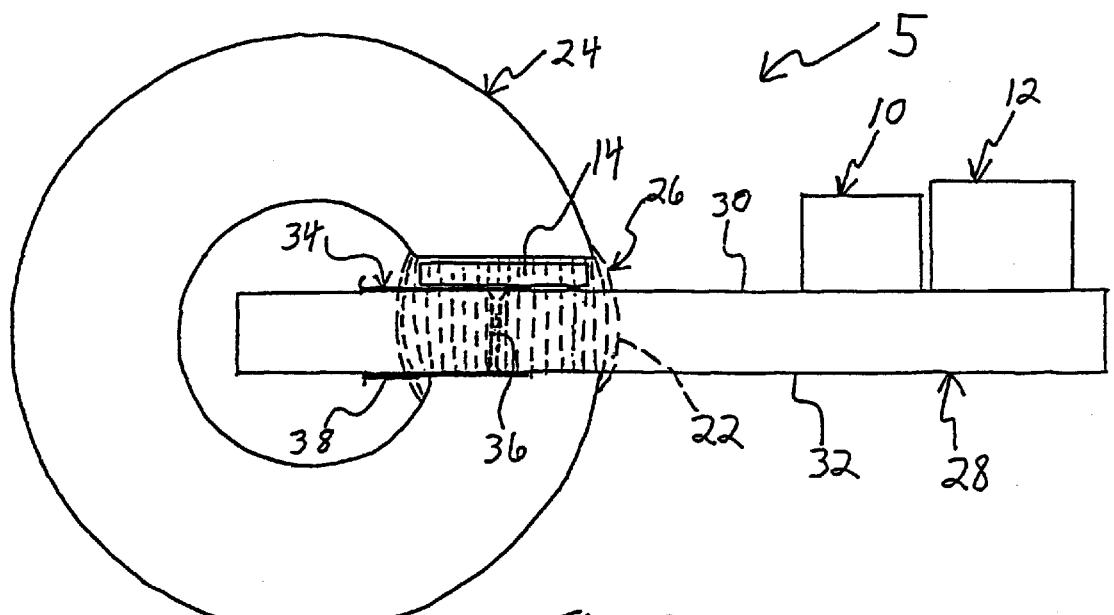
FIG. 2 is a front elevational view of the current sensor of the present invention illustrating the relative positions of the toroid core, the printed circuit board, the Hall effect generator, the first and second traces forming the non-inductive circuit means for electrically coupling the Hall effect output voltage to the amplifier, the control current source and the amplifier to each other.

In referring now to FIG. 2, a front elevational view of the current sensor of the present invention is shown. As illustrated, the Hall effect generator 14 can be seen to be positioned within a magnetic field, represented by dashed flux lines 22, preferably concentrated by a toroid core 24 having a gap 26. The toroid core 24 is mounted on a printed circuit board (PCB) 28. The PCB 28 comprises a first surface 30 and a second surface 32. The toroid core 24 is coupled to the PCB 28 by way of sliding the PCB 28 through the gap 26 of the toroid core 24 so as to position the hall effect generator 14, mounted on the PCB 28, within the gap 26. Once the PCB 28 is slid into the proper position, the toroid core 24 is secured in place by way of a dielectric paste placed between the second surface 32 of the PCB 28 and the toroid core 24. The dielectric paste is may be one of number of various standard dielectric pastes commonly used in the industry.

FIG. 2 illustrates the placement of the Hall effect generator 14 within the gap 26 and within the concentrated flow of the magnetic field 22 such that a voltage will be formed by the Hall effect generator 14 that is proportional to the current flowing in the current carrying conductor (not shown). The amplifier 10 and the control current source 12 are mounted on the first surface 30 of the PCB 28. It is preferable that the amplifier 10 and the control current source 12 be electrically coupled to the Hall effect generator 14 by way of conductive traces (not shown in complete form in FIG. 2 for simplicity sake) deposited on the first and second surfaces 30 and 32 of the PCB 28. The magnetic field 22 flows across the gap 26 of the toroid core 24 and impinges on the Hall effect generator 14 and non-inductive circuit means 16. It is preferable that the PCB 28 be formed from a dielectric material suitable for efficient flow of the magnetic field 22 across the gap 26 and through the PCB 28. It is also preferable that the PCB 28 be of a relatively thin dimension so as to minimize the gap 26 in the toroid core 24.

In regards to the non-inductive circuit means 16, shown in partial form in FIG. 2, deposited on the PCB 28, it is preferable that a thin layer of a dielectric material be placed over the non-inductive circuit means 16 thereby insulating the non-inductive circuit means 16 from the toroid core 24 mounted thereover.

Figure 3:
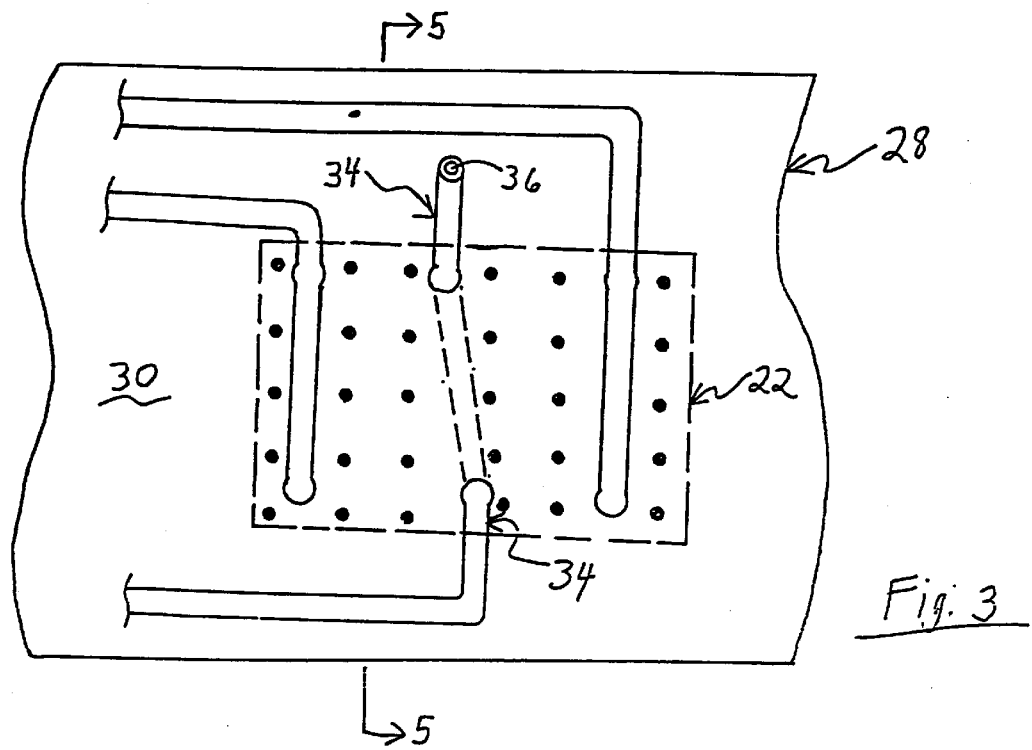
FIG. 3 is a top plan view of the printed circuit board illustrating the first trace configuration on the first surface in relation to the exposed region of the magnetic field, along with the correlation of the second trace configuration on the second surface of the printed circuit board.
Figure 4:
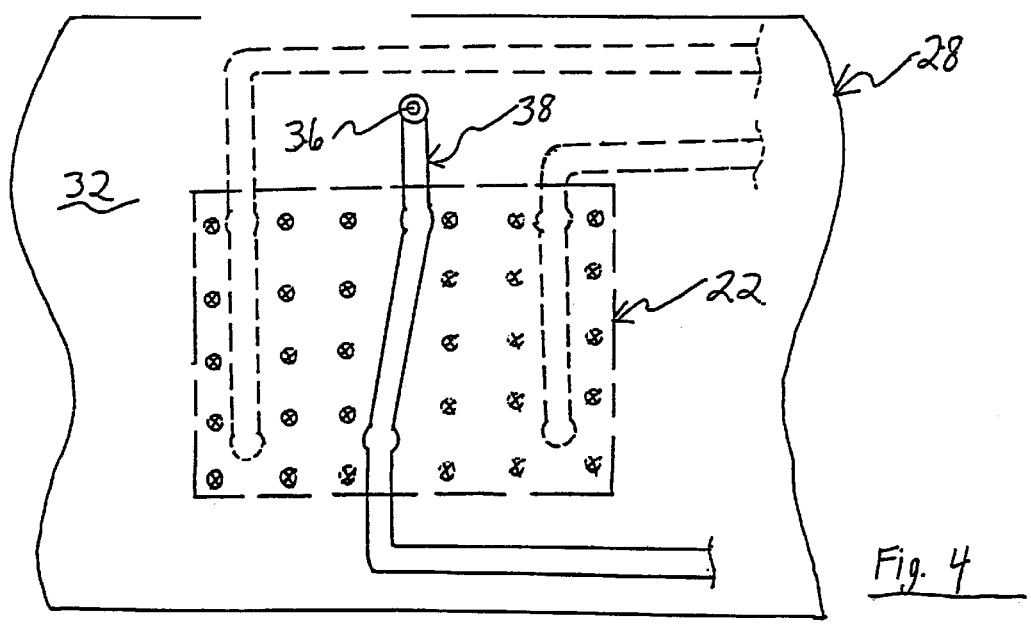
FIG. 4 is a bottom plan view of the printed circuit board illustrating the second trace configuration on the second surface relative to the first trace configuration on the first surface and the exposed region of the magnetic field.

In selecting the appropriate packaging of the Hall effect generator 14 for use in the present invention, it is preferable that the Hall effect generator 14 be in the form of a flip chip packaged device that facilitates being surface mounted to the PCB 28. Typically, the Hall effect generator 14 in a flip chip package has four terminals facilitating the electrical coupling of a current source and amplifier to the device. It is noted herein that only four terminals are electrically significant, however, six solderable pads may be included on the Hall effect generator 14 thereby providing two additional solderable pads for mechanical stability (as seen in FIGS. 3 and 4). The Hall effect generator 14 is then preferably mounted to the PCB 28 by way of soldering the Hall effect generator 14 at its output voltage terminals 18 and control current terminals 20 to the non-inductive circuit means 16. For the present invention, it is preferable that standard surface mount soldering methods commonly used in the industry be utilized.

In referring now to FIGS. 3 and 4, an enlarged partial view of the non-inductive circuit means 16 can be seen illustrating the specific configuration. The non-inductive circuit means 16 can be seen to be comprised of a first trace 34, a plated through hole 36 and a second trace 38. The first trace 34 on the first surface 30 of the PCB 28 is electrically coupled to the plated through hole 36 which extends through the PCB 28 and electrically couples to the second trace 38 on the second surface 32. The impinging magnetic field 22 can also be seen in FIGS. 3 and 4, represented generally by a dotted line marking the region of coverage and having solid dots indicating a direction coming out of the page and circles with a cross indicating a direction going into the page. Ultimately, the direction of the impinging magnetic field 22 depends on the directional current flow in the current carrying conductor (not shown) which could reverse the directions as depicted in the FIGS. 3 and 4 in accordance with the Right Hand Rule.

It is important to note that the second trace 38 on the second surface 32 aligns with and mirrors the first trace 34 on the first surface 30. This mirrored relationship between the first and second traces 34 and 38 is essential and critical to achieving a loop area of zero that would be exposed to the impinging magnetic field 22 flowing across the gap 26 of the toroid core 24. More specifically, FIG. 3 illustrates the first trace 34 on the first surface 30 and FIG. 4 illustrates the second trace 38 on the second surface 32.

Figure 5:
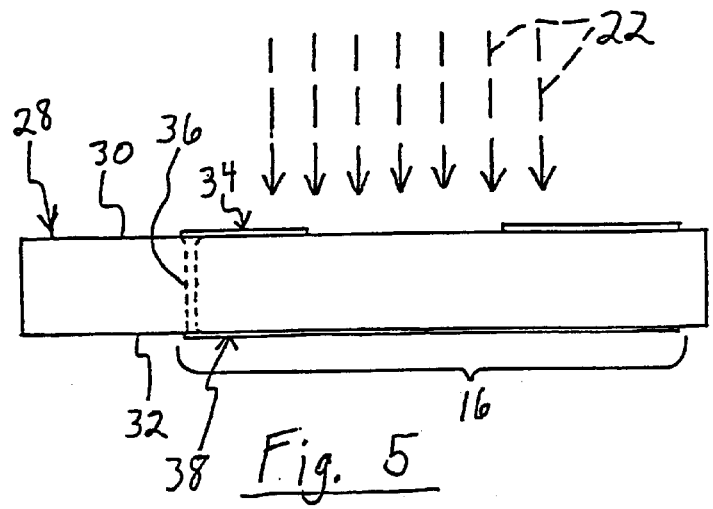
FIG. 5 is a cross sectional side view of the printed circuit board taken along the lines 5—5, as illustrated in FIG. 3, wherein the relative positions of the traces on the first and second surfaces of the printed circuit board and the plated through hole can be seen in their relative positions to each other.

In referring now to FIG. 5, a cross-sectional side view of the PCB 28 can be seen as taken along the lines 5—5 as illustrated in FIG. 3 which more clearly illustrates the layout configuration of the non-inductive circuit means 16. In FIG. 5 it can be seen that the first trace 34, the plated through hole 36 and the second trace 38 cooperate to form a loop that is parallel to the direction of the impinging magnetic field. It is preferable that the plated through hole 36 be of a sufficient diameter so as to facilitate the depositing of metallization uniformly throughout the plated through hole 36 and to provide a sound electrical connection between the first and second traces 34 and 38. It is further noted that the plated through hole 36 be positioned sufficiently away from the region of the impinging magnetic field 22. In selecting the toroid core 24, it is preferable that the toroid core 24 be formed from a magnetic material suitable for coupling the magnetic field 22 formed by the current flowing in the current carrying conductor and facilitating the efficient flow of the coupled magnetic flux through the toroid core 24 and across the gap 26 to impinge on the Hall effect generator 14.

Figure 6:
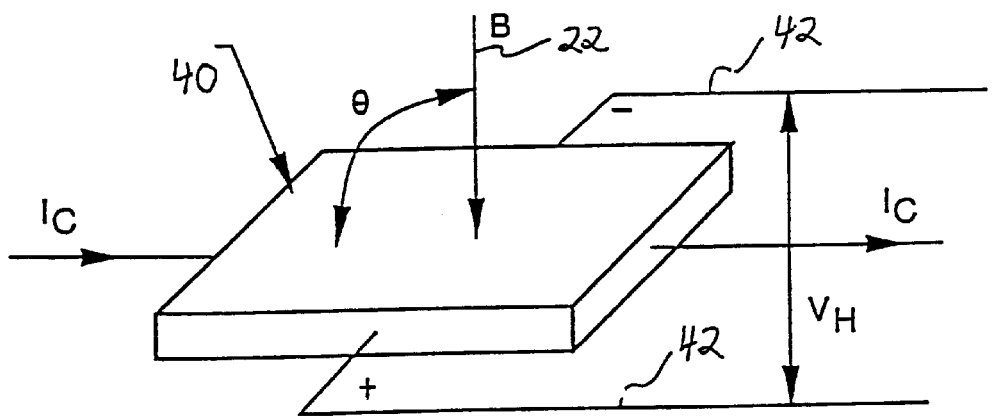
FIG. 6 is a perspective view of a Hall effect generator illustrating the operation of the Hall effect phenomenon and the relative relationships of the magnetic field, the control current and the Hall effect voltage.

Now that the structure of the current sensor 5 has been described in detail, its operation may readily be understood. In referring now to FIG. 6, a typical Hall effect generator 40 can be seen illustrating the relationship of the magnetic field B, the magnetic field angle θ, the control current $I_c$ and the output voltage $V_h$ from the typical Hall effect generator 40. It can be seen that the control current $I_c$ flows across the typical Hall effect generator 40 with a magnetic field B impinging upon the typical Hall effect generator 40 from a direction having an angle θ having an angular component that is perpendicular to the flow of the control current $I_c$. The output voltage $V_h$ produced in response to the magnetic field B and the control current $I_c$ is a differential voltage taken across the Hall effect generator 40 in an orthogonal relationship to the control current $I_c$ and the magnetic field B. The output voltage $V_h$ is created due to a phenomenon known as the "Hall effect". According to the "Hall effect" a particle with charge Q and velocity V moving within a magnetic field B experiences the Lorentz Force (F=Q (V×B)). In this relationship, the force direction is mutually perpendicular to the directions of the particle velocity and the magnetic field. Hence, under the influence of this force, the electrons resultingly "pile up" on one edge of the conductor.

Figure 7:
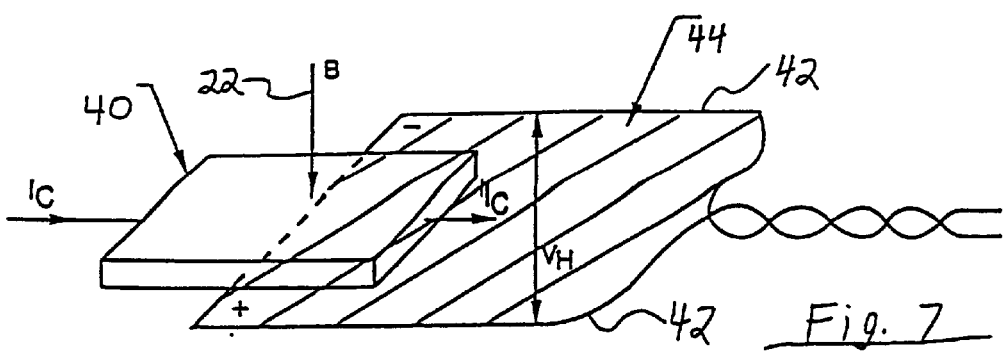
FIG. 7 is a perspective view of the Hall effect generator illustrating the typical output voltage electrical lead frame extending from a standard Hall effect generator presenting an inductive loop area which would be exposed to and perpendicular to the magnetic field and susceptible to producing unwanted induced voltages.

In referring now to FIG. 7, the typical Hall effect generator 40 can be seen having the typical output voltage lead frame 42 extending therefrom used to electrically couple the output voltage $V_h$ to additional circuitry for processing. However, it is important to note the inductive loop that is created by the lead frame 42 typically connected to standard Hall effect generators in the industry. This inductive loop presents a loop area 44 that is perpendicular to the directional flow of the magnetic field B that is impinging upon the Hall effect generator 40 such that unwanted induced voltages are formed in the lead frame 42 which add to the produced output voltage $V_h$ and compromise measurement accuracy.

In short, the present invention provides for the output voltage produced by the Hall effect generator 14 to be electrically coupled to the amplifier 10 without having any inductive loop area created that is exposed perpendicularly to the directional flow of the impinging magnetic field, represented in FIGS. 1 through 5 by reference numeral 22.

The present disclosure includes that contained in the appended claims, as well as that of the foregoing description. Although this invention has been described in its preferred form with a certain degree of particularity, it should be understood that the present disclosure of the preferred form has been made only by way of example and that numerous changes in the details of construction and the combination and arrangement of parts may be resorted to without departing from the spirit and scope of the invention.

Now that the invention has been described,

What is claimed is:

1. A sensor for sensing electrical current in a current carrying conductor comprising in combination:

a printed circuit board, said printed circuit board having a first surface and a second surface;

a toroid core having a gap, said toroid core being coupled to said printed circuit board so as to facilitate receiving the current carrying conductor through said toroid core;

a Hall effect generator, said Hall effect generator being surface mounted to said printed circuit board and located within said gap of said toroid core, said Hall effect generator being free of inductive leads;

current source means for providing a control current to said Hall effect generator; said current source means being electrically coupled to said Hall effect generator;

amplifier means for amplifying the output voltage from said Hall effect generator; and non-inductive circuit means for electrically coupling said amplifier means to said Hall effect generator free from any unwanted induced voltages being generated therein by the magnetic field;

whereby a magnetic field is created in said toroid core and across said gap and across said Hall effect generator when electrical current flows through the current carrying conductor, said Hall effect generator producing an output voltage that is proportional to the magnetic field, said Hall effect generator and said non-inductive circuit means facilitating the prevention of unwanted voltages being introduced into the output voltage thereby achieving an improved transient response, wherein said non-inductive circuit means is comprised of a first trace and a second trace cooperatively positioned on said first and second surfaces of said printed circuit board so as to align with and mirror each other, said first and second traces being electrically coupled to each other whereby zero loop area results perpendicular to the direction of the impinging magnetic field.

2. A current sensor as recited in claim 1, wherein said printed circuit board further includes metalization on said first and second surfaces whereby said printed circuit board is capable of conducting electrical signals on said first and second surfaces.

3. The current sensor as recited in claim 1, wherein said first trace is electrically coupled to said second trace by a plated through hole extending through said printed circuit board from said first surface to said second surface.

4. The current sensor as recited in claim 3, wherein said Hall effect generator is in the form of a flip chip packaged device facilitating being surface mounted on said first surface of said printed circuit board.

5. The current sensor as recited in claim 1, wherein said Hall effect generator is formed InAs.

6. The current sensor as recited in claim 1, wherein said hall effect generator is formed from GaAs.

* * * * *